(12) United States Patent
Mital et al.

(10) Patent No.: US 9,473,357 B2
(45) Date of Patent: Oct. 18, 2016

(54) GUARANTEEING BANDWIDTH FOR DUAL-HOMED HOSTS IN FABRIC EXTENDER TOPOLOGIES

(71) Applicant: Cisco Technology, Inc., San Jose, CA (US)

(72) Inventors: Bhuvan Mital, Santa Clara, CA (US); Rajagopal Subramaniyan, San Jose, CA (US); Lalitha Krishnan, Cupertino, CA (US); Narasimhan G Mandeyam, San Jose, CA (US); Yiqing Zhu, Fremont, CA (US); Kalyan Ghosh, Saratoga, CA (US); Dean Houari, Tokyo (JP)

(73) Assignee: Cisco Technology, Inc., San Jose, CA (US)

( * ) Notice: Subject to any disclaimer, the term of this patent is extended or adjusted under 35 U.S.C. 154(b) by 150 days.

(21) Appl. No.: 14/163,313

(22) Filed: Jan. 24, 2014

(65) Prior Publication Data
US 2015/0215169 A1 Jul. 30, 2015

(51) Int. Cl.
*H04L 12/24* (2006.01)
*H01L 41/083* (2006.01)
*H04L 12/26* (2006.01)

(52) U.S. Cl.
CPC ......... *H04L 41/0896* (2013.01); *H01L 41/083* (2013.01); *H04L 43/0894* (2013.01)

(58) Field of Classification Search
None
See application file for complete search history.

(56) References Cited

U.S. PATENT DOCUMENTS

| | | | |
|---|---|---|---|
| 7,760,738 B1* | 7/2010 | Chamas et al. | H04L 12/4675 370/238 |
| 2006/0239271 A1* | 10/2006 | Khasnabish et al. | H04L 45/00 370/395.21 |
| 2007/0093124 A1* | 4/2007 | Varney et al. | 439/499 |
| 2007/0118643 A1* | 5/2007 | Mishra et al. | H04L 41/082 709/224 |
| 2007/0258380 A1* | 11/2007 | Chamdani et al. | 370/252 |
| 2012/0093034 A1* | 4/2012 | Kamath et al. | 370/255 |
| 2012/0287930 A1 | 11/2012 | Raman | |
| 2012/0307828 A1* | 12/2012 | Agarwal et al. | H04L 49/70 370/392 |
| 2013/0339776 A1* | 12/2013 | Jagadishprasad et al. | 713/340 |
| 2014/0199062 A1* | 7/2014 | In De Betou et al. | H04W 24/04 398/5 |
| 2015/0016298 A1* | 1/2015 | Ganichev et al. | H04L 43/0894 370/253 |
| 2015/0163072 A1* | 6/2015 | Kalkunte et al. | H04L 12/4633 370/392 |
| 2015/0163173 A1* | 6/2015 | Chu et al. | 370/338 |
| 2015/0195178 A1* | 7/2015 | Bhattacharya et al. | 370/248 |

* cited by examiner

*Primary Examiner* — Hassan Kizou
*Assistant Examiner* — Deepa Belur
(74) *Attorney, Agent, or Firm* — Edell, Shapiro & Finnan, LLC (57) ABSTRACT

Techniques are provided for optimizing bandwidth in a network. Information describing a network bandwidth capacity of a port extender device is received at a switch. The port extender device is connected to the switch. The port extender device is configured to provide ports for the switch. The network bandwidth capacity of the port extender device is compared to a minimum network bandwidth guarantee threshold. If the switch determines that the network bandwidth capacity of the port extender device is below the minimum network guarantee threshold, the switch sends to the port extender device a message configured to cause the port extender to deactivate one or more links between the port extender device and one or more servers in communication with the port extender device.

18 Claims, 9 Drawing Sheets

GUARANTEEING BANDWIDTH FOR DUAL-HOMED HOSTS IN FABRIC EXTENDER TOPOLOGIES

TECHNICAL FIELD

The present disclosure relates to bandwidth optimization in networks.

BACKGROUND

Switch devices are deployed in networks to manage communications to and from servers. In some network topologies, servers may be dually-homed. The dually-homed servers may be in an active-active mode, allowing communications to be exchanged by a server across multiple active communication links. Alternatively, the dually-homed servers may be in an active-standby mode, enabling communications to be exchanged by a server via one communication link while maintaining another communication link in a dormant, standby mode. Certain network topologies may also comprise one or more port extender devices. The port extender devices are intermediary devices between the servers and the switches.

DESCRIPTION OF EXAMPLE EMBODIMENTS

Overview

Techniques are described herein for optimizing bandwidth in a network. Information describing a network bandwidth capacity of a port extender device is received at a switch. The port extender device is connected to the switch. The port extender device is configured to provide ports for the switch. The network bandwidth capacity of the port extender device is compared to a minimum network bandwidth guarantee threshold. If the switch determines that the network bandwidth capacity of the port extender device is below the minimum network guarantee threshold, the switch sends to the port extender device a message configured to cause the port extender to deactivate one or more links between the port extender device and one or more servers in communication with the port extender device.

Example Embodiments

The techniques presented herein relate to bandwidth optimization in a network. In particular, these techniques enable switch devices to guarantee minimum network bandwidth requirements by instructing port extender devices in the network to deactivate communication links, when appropriate.

Figure 1:
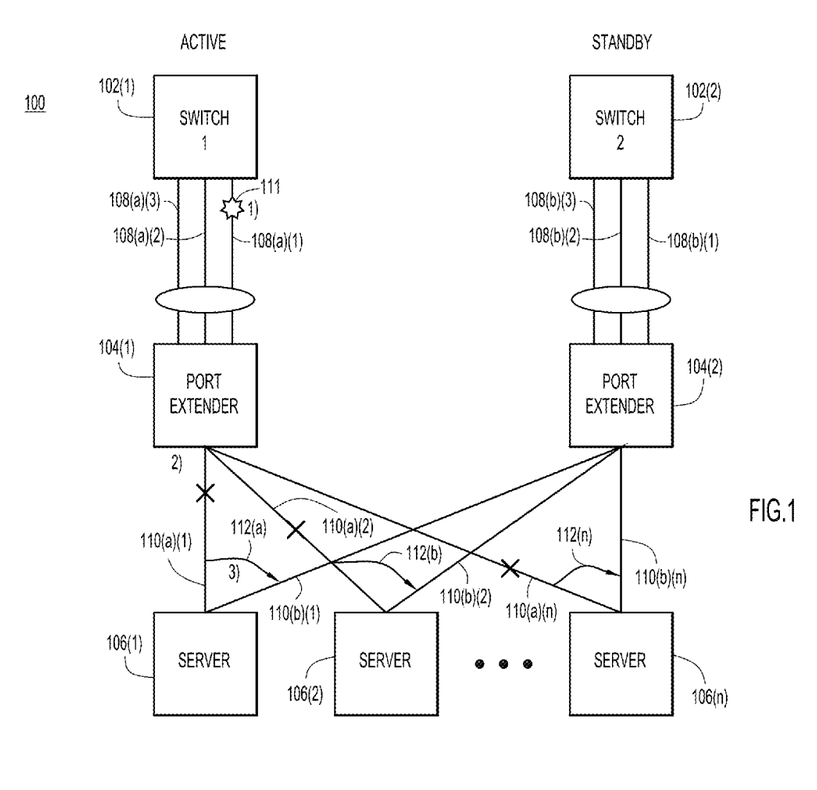
FIG. 1 shows an example network topology depicting a plurality of switch devices each in communication with single-homed port extender device.

An example network topology ("network") is shown at reference numeral 100 in FIG. 1. The network 100 in FIG. 1 comprises a plurality of switch devices (referred to hereinafter as "switches"). The switches are shown at reference numerals 102(1) and 102(2) and are referred to respectively as switch 1 and switch 2. Though not shown in FIG. 1, the network 100 may have other switches. The network 100 also has a plurality of port extender devices ("port extenders"), shown at reference numerals 104(1) and 104(2). The port extender 104(1) is also referred to port extender 1, and the port extender 104(2) is also referred to as port extender 2. The network 100 also has a plurality of servers, shown at reference numerals 106(1)-106(n).

Switch 1 is connected to port extender 1 via a plurality of network links ("links") 108(a)(1)-108(a)(3). Likewise, switch 2 is connected to port extender 2 via a plurality of links 108(b)(1)-108(b)(3). The servers 106(1)-106(n) are also connected to the port extenders, and as shown in FIG. 1, each of the servers 106(1)-106(n) is connected to both port extender 1 and port extender 2. Servers 106(1)-106(n) are connected to port extender 1 via respective links 110(a)(1)-110(a)(n) and are connected to port extender 2 via respective links 110(b)(1)-110(b)(n).

Switch 1 and switch 2 are network switch devices. For example, switch 1 and switch 2 are configured to manage and route communications originating from and destined for the servers 106(1)-106(n). As stated above, switch 1 is in communication with port extender 1 and switch 2 is in communication with port extender 2. In general, a port extender is a network device that is configured to interface with a port or ports of a switch. The port extender provides additional ports (e.g., physical ports) for the switch at the particular port of the switch to which the port extender has interfaced. For example, the port extender may represent a plurality of physical ports of the switch, and accordingly, the port extender may provide the switch with additional ports, even though the port extender may be interfaced to only one port of the switch. A port extender may also be interfaced to one or more ports of a switch depending on oversubscription requirements. In general, port extender 1 and port extender 2 may be provisioned by switch 1 and switch 2, respectively.

The servers 106(1)-106(n) are devices that are configured to send and receive network communications to each other via the port extenders and the switches. For example, server 106(1) may send communications to another server in the network 100 by sending a packet to switch 1 via port extender 1. Alternatively, as shown in FIG. 1, server 106(1) may send communications to another server in the network 100 by sending a packet to switch 2 via port extender 2. Since server 106(1) is configured to send communications to either switch 1 (via port extender 1) or switch 2 (via port extender 2), server 106(1) is said to be a dual-homed server. The term "dual-homed" or "dually-homed" may include characteristics of devices that may be "homed" with multiple devices (e.g., "multi-homed").

In some scenarios, server 106(1) may be able to use both link 110(a)(1) and link 110(b)(1), at the same time, to send communications. In this example, server 106(1) is said to be in an "active-active" mode (e.g., both links 110(a)(1) and 110(b)(1) are "active" for network communications). In another example, server 106(1) may be able to use only one link at a time to send network communications. For example, server 106(1) may use either link 110(a)(1) or link 110(b)(1) to send communications, but not both links. In this example, server 106(1) is said to be in an "active-passive" mode (e.g., only one link is "active" for network communications, while the other link is "passive" or "inactive"). For servers in an active-passive mode, links may change their status from "active" to "passive" or from "passive" to "active" based on network conditions. For simplicity, the techniques described herein assume that servers 106(1)-106(n) are configured in an "active-passive" mode, though it should be appreciated that these techniques may be applicable to servers in an "active-active" mode. It should also be appreciated that the terms "standby" and "passive" are used interchangeably herein.

The port extenders may also be dually-homed. In FIG. 1, however, port extender 1 and port extender 2 are connected only to switch 1 and switch 2, respectively. Thus, port extender 1 and port extender 1 in FIG. 1 are said to be "single-homed" or "straight through" devices. For servers with active links to port extender 1, communications to and from these servers are managed by switch 1 via one or more of links 108(a)(1)-108(a)(3). Likewise, for servers with active links to port extender 2, communications to and from these servers are managed by switch 2 via one or more links 108(b)(1)-108(b)(3).

Switch 1 and switch 2 are provisioned with network service information. For example, switch 1 and switch 2 may be provisioned, a priori, with network service information associated with the servers 106(1)-106(n). This network service information may comprise, for example, information about the priority status of the servers 106(1)-106(n). One or more servers may be designated with a relatively high priority and other servers may be designated with a relatively low priority. The network service information may also comprise minimum bandwidth guarantee information. That is, switch 1 and switch 2 may be provided with information that indicates a guaranteed level of bandwidth that must be provided to each of the servers 106(1)-106(n). This guaranteed bandwidth level may depend on the priority status for each server, and thus, relatively high priority servers may have a guarantee of a higher bandwidth than servers with a relatively low priority.

Switch 1 and switch 2 are responsible for fulfilling the requirements of the network service information. For example, switch 1 and switch 2 are responsible for ensuring that the guaranteed network bandwidth requirements are met. In one example, each of switch 1 and switch 2 may evaluate or determine a number of links that are available for communication with port extender 1 and port extender 2. If the number of available links is less than a minimum network link requirement, switch 1 and switch 2 may take corrective action to ensure a minimum network bandwidth guarantee. In other words, switch 1 and switch 2 may each be provisioned with minimum network link information ("min link") that describes the minimum required number of links that must be active with the respective port extenders. In one example, if the min link requirement is not met switch 1 and switch 2 may take corrective action, including sending instructions to respective port extenders, and eventually to the servers 106(1)-106(n)) to activate the "passive" links of the dually-homed servers 106(1)-106(n) and to deactivate the "active" links of the dually-homed servers 106(1)-106(n). These techniques are described further hereinafter. It should be appreciated that metrics other than or in addition to minimum network link information may be used by switch 1 and switch 2 to evaluate whether or not network bandwidth guarantees have been met. For example, Quality of Service (QoS) mechanisms with network policing and shaping may be used to determine whether or not network bandwidth guarantees have been met. In one example, as shown in FIG. 1, switch 1 and switch 2 are provisioned with network service information. In this example, switch 1 and switch 2 are provisioned with information that the minimum network links threshold/requirement is three (3). Thus, there must be three or more links between a switch and a corresponding port extender to ensure that the switch can fulfill the minimum network bandwidth guarantee threshold. In FIG. 1, switch 1 is shown as an active switch (since, in this example, all of the dually-homed servers 106(1)-106(n) have active links connected to port extender 1), and switch 2 is shown as a passive link. Thus, in the example shown in FIG. 1, if the number of links between the active switch (switch 1) and the corresponding port extender (port extender 1) is greater than or equal to the minimum network links requirement (e.g., three links), switch 1 will continue to manage communications of the servers 106(1)-106(n). If, however, the number of links between switch 1 and port extender 1 is less than the minimum network links requirement (e.g., in response to a link failure event shown at reference numeral 111), switch 1 can no longer fulfill the minimum network bandwidth guarantee requirements, and thus, switch 1 deactivates to a "standby" mode and switch 2 activates to an "active mode." In this scenario, the bandwidth capacity of port extender 1 is said to be less than the minimum network bandwidth guarantee. In order to instruct the port extender transition, switch 1, upon determining that the network bandwidth capacity of port extender 1 is below the threshold, sends a message to port extender 1 to cause port extender 1 to deactivate one or more network links between port extender 1 and the servers 106(1)-106(n). Switch 1 may, for example, receive the minimum links information via a message from port extender 1. Thus, in response to a "min-links" failure, switch 1 sends a message to port extender 1 which instructs the servers 106(1)-106(n) to switch their "active" links to passive links. The servers 106(1)-106(n), upon detecting that the formerly active links are now inactive, will switch the passive links to the active status (e.g., will automatically activate communication links with port extender 2), as shown at reference numeral 112(a)-112(n) in FIG. 1. Upon activating such links, switch 2 will then be able to send and receive communications of the servers 106(1)-106(n). If at a later time switch 2 is unable to fulfill the minimum network bandwidth guarantee, switch 1 will be reactivated, provided that switch 1 fulfills the bandwidth requirements.

Figure 2A:
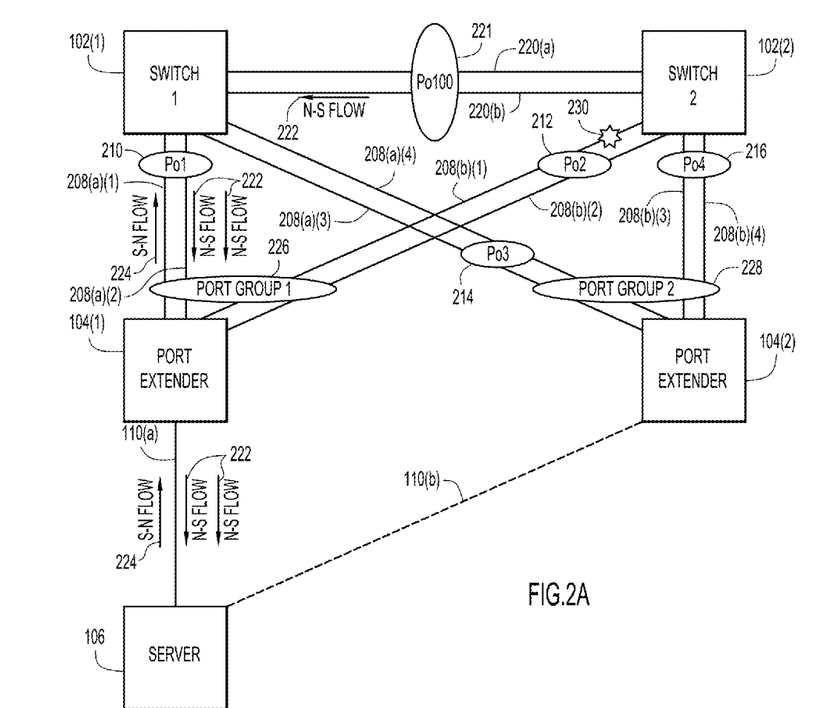
FIGS. 2A-2B show example network topologies depicting the switch devices each in communication with a dual-homed port extender device and configured to evaluate first and second bandwidth capacities of the dual-homed port extender device.
Figure 2B:
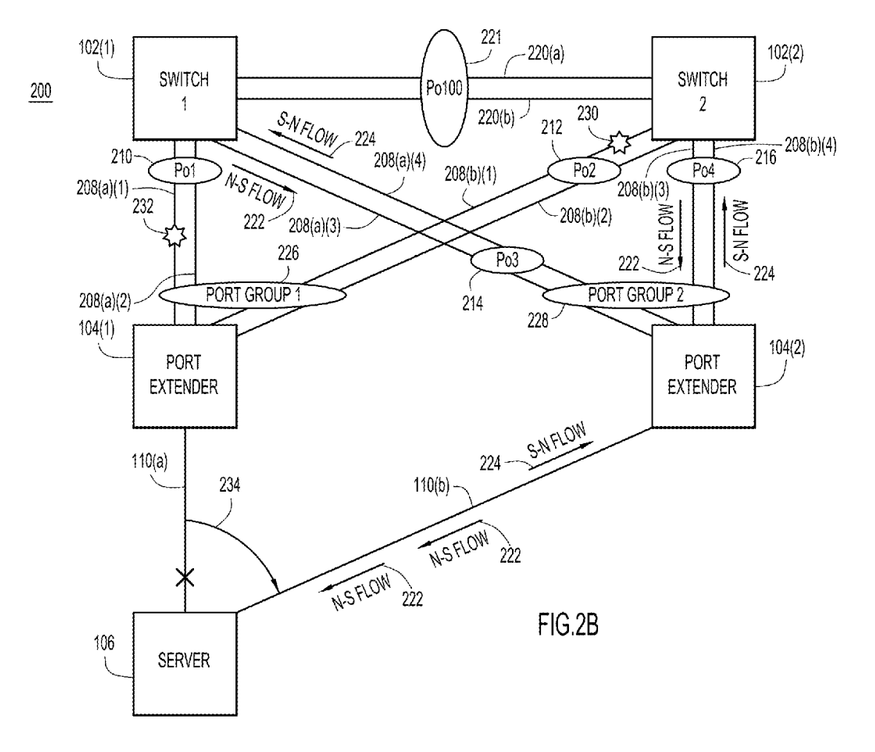

Reference is now made to FIGS. 2A and 2B. FIGS. 2A and 2B show example network topologies that depict switch 1 and switch 2 in communication with dual-homed port extenders and configured to evaluate bandwidth capacities of the port extenders. Referring first to FIG. 2A, FIG. 2A shows a network 200 that is similar to the network 100 shown in FIG. 1. For example, FIG. 2A shows switch 1, switch 2, port extender 1 and port extender 2. FIG. 2A also shows a single server 106, and it should be appreciated that server 106 may represent any of the servers 106(1)-106(n) described in connection with FIG. 1. In FIG. 2A, the server 106 is an "active-passive" dual-homed server. The server 106 has an initial active link at 110(a) and has an initial passive link at 110(b). As described above, port extender 1 and port extender 2 may also be dual-homed. As stated above, the dually-homed port extender 1 and port extender 2 may also be referred to as being "multi-homed" devices. Thus, port extender 1 is connected to both switch 1, via links 208(a)(1) and 208(a)(2), and switch 2, via links 208(b)(1) and 208(b)(2). Likewise, port extender 2 is connected to both switch 1, via links 208(a)(3) and 208(a)(4), and switch 2, via links 208(b)(3) and 208(b)(4).

The links from port extender 1 are shown in two groups: a first group comprising links 208(a)(1) and 208(a)(2) between port extender 1 and switch 1, and a second group comprising links 208(b)(1) and 208(b)(2) between port extender 1 and switch 2. The first group of links for port extender 1 is shown, at 210, as link-group "Po1" in FIG. 2A and the second group of links for port extender 1 is shown, at 212, as link-group "Po2" in FIG. 2A. Likewise, the links from port extender 2 are also shown in two groups: a first group comprising links 208(a)(3) and 208(a)(4) between port extender 2 and switch 1 and a second group comprising links 208(b)(3) and 208(b)(4) between port extender 2 and switch 2. The first group of links for port extender 2 is shown, at 214, as link-group "Po3" and the second group of links for port extender 2 is shown, at 216, as link-group "Po4" in FIG. 2A.

In FIG. 2A, switch 1 and switch 2 are connected to each other via links 220(a) and 220(b). Link 220(a) and 220(b) are part of a port channel, shown at reference numeral 221 and designated as "Po100" in FIG. 2A and elsewhere. FIG. 2A also shows, at 222, a plurality of communications from the switches to the server 106 (also referred to as "north-south flows" or "N-S flows") and shows, at 224, a plurality of communications from the servers 106 to the switches (also referred to as "south-north flows" or "S-N flows").

As stated above, links from port extender 1 and the switches are shown at Po1 and Po2. Also, links from port extender 2 and the switches are shown at Po3 and Po4. A larger group for port extender 1 is also shown, at 226, which comprises groups Po1 and Po2. This group is referred to as "port group 1." Likewise, a larger group for port extender 2 is shown, at 228, which comprises groups Po3 and Po4. This group is referred to as "port group 2."

As described in connection with FIG. 1, above, switch 1 and switch 2 are provisioned to ensure that minimum network bandwidth requirements are met. In FIG. 2A, both switch 1 and switch 2 are active switches, since they both handle traffic from the server 106 via an active link of the server 106. For example, the server 106 may have an active link with port extender 1 and may have a passive link with port extender 2. Thus, the server 106 may send and receive communications with switch 1 via port extender 1 and the links in group Po1 between port extender 1 and switch 1. Likewise, the server 106 may send and receive communications with switch 2 via port extender 1 and the links in group Po2 between port extender 2 and switch 2.

In FIG. 2A, it is assumed that the "min-links" requirement is two (2). FIG. 2A shows a link failure event at 230. At 230, link 208(b)(1) in link-group Po2 fails. In FIG. 2A, switch 1 and switch 2 evaluate the "min-links" requirement on a per link-group basis. That is, as long as one of the link-groups for port extender 1 (link-groups Po1 or Po2) does not fall below the "min-links" requirement, a switch will not initiate a port extender change event. In FIG. 2A, the link failure event 230 results in link-group Po2 falling below the minimum links requirement. However, in FIG. 2A, link-group Po1 still meets the minimum links criteria (since Po1 still has two links), and thus, switch 1 or switch 2 will not initiate a port extender change event. In other words, in FIG. 2A, as long as one leg of the port group 1 meets the minimum links criteria, a port extender change event will not occur, and communications will remain between server 106 and switch 1 and switch 2 via port extender 1.

FIG. 2B shows conditions resulting in a port extender change event in the topology described in connection with FIG. 2A. FIG. 2B shows components in the network 200 similar to those described in connection with FIG. 2A. FIG. 2B also shows an additional link failure event at 232. At 232, link 208(a)(1) in link-group Po1 fails. As stated above in connection with FIG. 2A, switch 1 and switch 2 will not initiate a port extender change event as long as one of the link-groups Po1 and Po2 for port extender 1 does not fall below the "min-links" requirement. If, however, both of the link-groups Po1 and Po2 for port extender 1 fall below the "min-links" requirement, switch 1 or switch 2 (or both) will initiate a port extender change event. In FIG. 2B, the link failure event 230 reduces the number of available links in Po2 to one, and also, the link failure event 232 reduces the number of available links in Po1 to one. Thus, neither link-group Po1 nor Po2 meets the "min-links" requirement. Accordingly, switch 1 or switch 2 (or both) sends a message to port extender 1 that is configured to cause port extender 1 to deactivate the link 110(a) between port extender 1 and the server 106. Upon having this link deactivated, the server 106 will activate the passive link 110(b), and communications between the server 106 and switch 1 and switch 2 will resume via port extender 2 and link groups Po3 and Po4.

In one example, switch 1 may determine that neither Po1 nor Po2 meets the "min-links" requirement by receiving first network bandwidth capacity information descriptive of a first network bandwidth capacity between port extender 1 and switch 1 and by receiving second network bandwidth capacity information descriptive of a second network bandwidth capacity between port extender 1 and switch 2. The first network bandwidth capacity information includes, e.g., information about the number of available links in Po1, and the second network bandwidth capacity information includes, e.g., information about the number of available links in Po2 (e.g., received by switch 1 from switch 2 via links 220(a) and/or links 220(b) of port channel Po100). Likewise, switch 2 may also make a similar determination for the links in Po2 and Po1 (e.g., by receiving the number of available links in Po2 between port extender 1 and switch 2 and by receiving, from switch 1 via links 220(a) and/or 220(b), the number of available links in Po1 between port extender 1 and switch 1). When both the first network bandwidth capacity and the second network bandwidth capacity are below the minimum bandwidth guarantee threshold (e.g., when both Po1 and Po2 are below the "min-links" threshold), switch 1 or switch 2 may send to port extender 1 a message configured to cause port extender 1 to deactivate links between port extender 1 and the server 106.

Figure 3A:
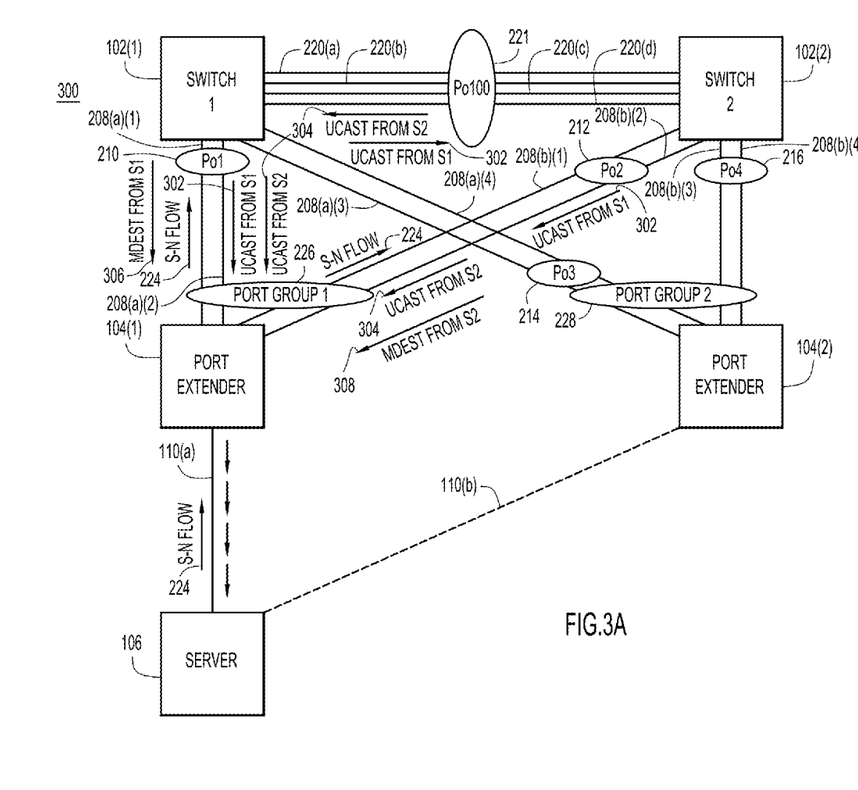
FIGS. 3A-3D show example network topologies depicting the switch devices each in communication with the dual-homed port extender device and configured to evaluate the total bandwidth capacity of the dual-homed port extender device.
Figure 3B:
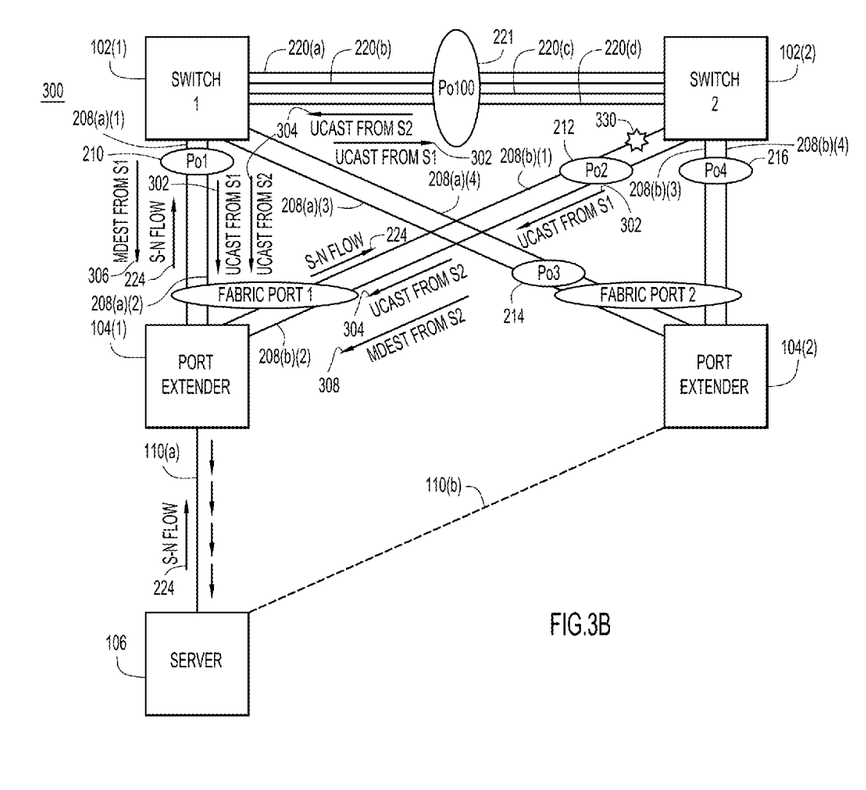
Figure 3C:
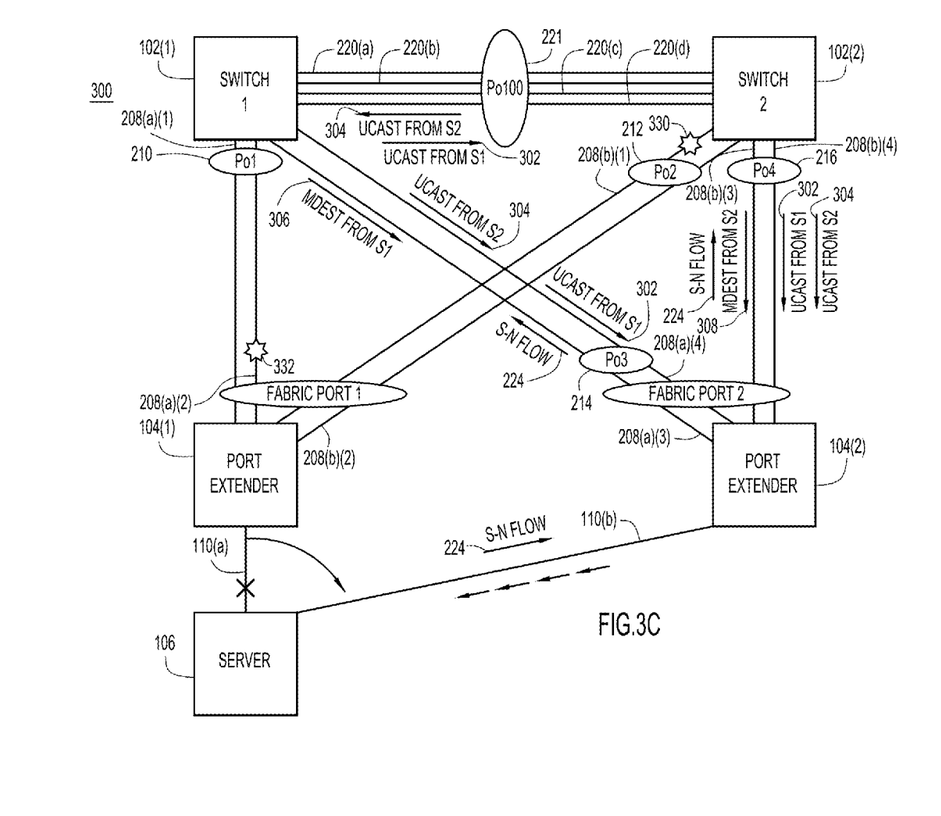

Reference is now made to FIGS. 3A-3C. FIGS. 3A-3C show example network topologies with switch 1 and switch 2 each in communication with dually-homed (e.g., multi-homed) port extender 1 and dually-homed port extender 2, and configured to evaluate the total bandwidth capacities of the port extenders. Referring first to FIG. 3A, a network 300 is shown. Network 300 in FIG. 3A has components similar to network 200 described in connection with FIGS. 2A and 2B, above. In addition to the components of network 200, network 300 in FIG. 3A shows additional links 220(c) and 220(d) in port channel Po100 between switch 1 and switch 2. Additionally, network 300 has, at 302, unicast flows from switch 1. Additionally, network 300 has, at 304, unicast flows from switch 2 and also shows, at 306, multicast and flooding flows ("multi-destination flows" or "mdest flows") from switch 1. Network 300 has, at 308, multi-destination flows from switch 2.

In FIG. 3A, the server 106 is an active-passive dually-homed server, with an active link to port extender 1 and a passive link to port extender 2. Thus, in FIG. 3A, when the min-links threshold is three (3), for unicast packets from switch 1 to the server 106, two-thirds of the packets will be received by the server 106 via the links in Po1 and one-third of the packets will be received by the server 106 via the links in Po2. For unicast packets from switch 2 to the server 106, two-thirds (⅔) of the packets will be received by the server 106 via the links in Po2, and one-third (⅓) of the packets will be received by the server 106 via the links in Po1.

Figure 3D:
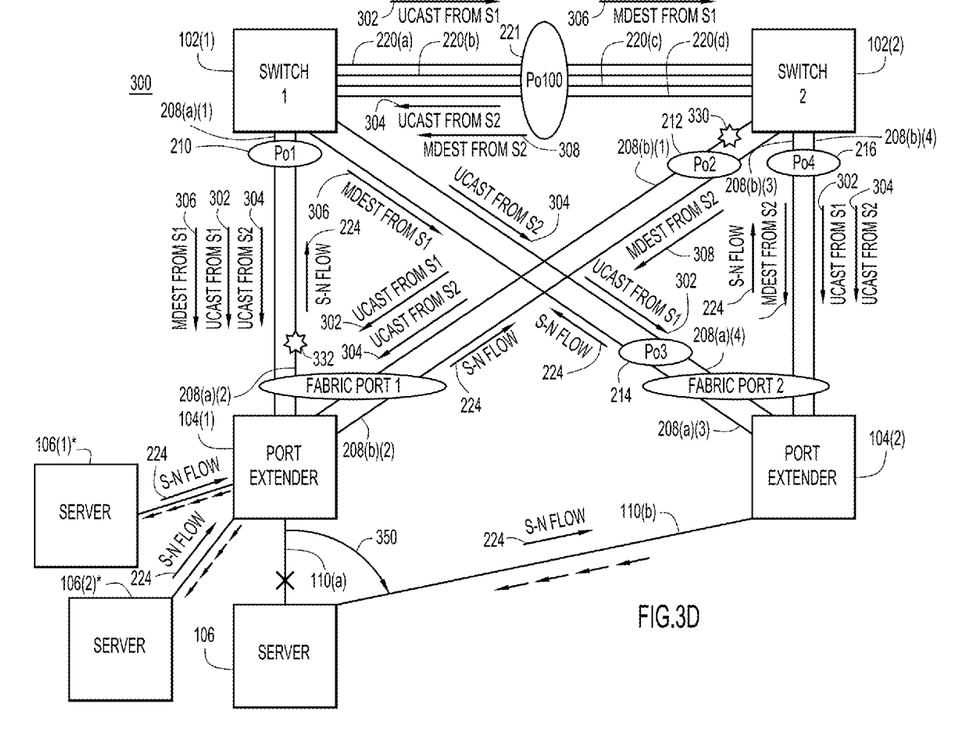

In FIG. 3A, switch 1 and switch 2 evaluate the total bandwidth capacity of the port groups as a whole. That is, switch 1 and switch 2 evaluate the number of available links in port group 1, which includes all of the available links in link-group Po1 and all of the available links in link-group Po2. If the total number of links available in port group 1 is greater than or equal to the min-links threshold, switch 1 and switch 2 will not initiate a port extender change event (as demonstrated in FIG. 3B). If, however, the total number of links available in port group 1 is less than the min-links threshold switch 1 and/or switch 2 may initiate a port extender change event (as shown in FIG. 3C), or alternatively, as shown in FIG. 3D, switch 1 and/or switch 2 may initiate a selective suspension of links between the server 106 and the port extender 1. Thus, switch 1 and/or switch 2 will deactivate or selectively suspend the network link between the server 106 and port extender 1 when the total network bandwidth capacity is below the minimum bandwidth guarantee threshold. These examples are described below.

Reference is now made to FIG. 3B. FIG. 3B shows a link failure event 330 in network 300, where link 208(b)(1) fails or is otherwise removed from the network 300. As stated above, switch 1 and switch 2 evaluate the number of available links in port group 1, which includes all of the available links in link-group Po1 and all of the available links in link-group Po2. If the min-links threshold is three, neither switch 1 nor switch 2 will initiate a port extender change event, since the total number of links in port group 1 is still three (two from link-group Po1 and one from link-group Po2). However, for unicast cast packets between switch 2 and the server 106, one-third (⅓) of the packets will flow to the server 106 via the links in Po2, since one link in Po2 has failed. The remaining two-thirds (⅔) of the packets will flow to the server 106 via the links in Po1.

Reference is now made to FIG. 3C. FIG. 3C shows a link failure event 332 in network 300, in addition to the link failure event 330 described in connection with FIG. 3B above. In FIG. 3C, switch 1 and/or switch 2 will evaluate the number of available links in port group 1. Assuming a min-links threshold of three, switch 1 and/or switch 2 will determine that the number of links in port group 1 is less than the min-links threshold, since port group 1 now only has two available links. Accordingly, in the example depicted in FIG. 3C, switch 1 and/or switch 2 will initiate a port extender change event similar to that described in connection with FIG. 2B, where switch 1 or switch 2 instructs port extender 1 to deactivate the link between port extender 1 and the server 106. In this case, for unicast traffic from switch 1 to server 106, one-third (⅓) of the traffic will flow via the links in Po4 and two-thirds (⅔) of the traffic will flow via the links in Po3. For unicast traffic from switch 2 to server 106, one-third (⅓) of the traffic will flow via the links in Po3, and two-thirds (⅔) will flow via the links in Po4.

Reference is now made to FIG. 3D, which shows a topology similar to FIG. 3C, with additional servers 106(1)* and 106(2)*. In FIG. 3D, switch 1 and/or switch 2 may selectively suspend the port extender change event for some servers, in response to the min-link threshold failure described in FIG. 3C. For example, in FIG. 3D, the servers 106(1)* and 106(2)* may be designated as high priority servers, and thus, for those servers, the active link between the high priority servers and port extender 1 may not be deactivated. In other words, switch 1 and/or switch 2 may be aware (e.g., a priori or via a user configuration) of high priority servers in the network 100, and may send instructions to port extender 1 to cause port extender 1 to maintain the network links between the high priority servers and port extender 1 in an active mode (even when the min-links threshold is not met by port extender 1), while also sending instructions to port extender 1 to cause port extender 1 to deactivate the network links between the lower priority servers and port extender 1. Thus, the high priority servers may experience minimal traffic disruption that may result from the port extender change event. In this example, the high priority servers will still utilize available links between port extender 1 and switch 1 and switch 2, which include the links in Po1 and Po2 that did not experience the link failure event (e.g., active links 208(a)(1) and links 208(b)(2)). In this example, it is understood that though the min-links threshold is not met, the minimum network bandwidth guarantee is met for the high priority servers. FIG. 3D shows, at 350, server 106 (a low priority server) undergoing the port extender change event by switching its link to port extender 2 from a passive mode to an active mode. However, the links between the high priority servers 106* and port extender 1 remain active.

In the example where switch 1 and/or switch 2 selectively suspend the port extender change event for high priority servers, for unicast communications between switch 1 and the high priority servers, one-half of the traffic will flow on the remaining active link in Po1 and one-half of the traffic will flow on the remaining active link in Po2. Likewise for unicast communications between switch 2 and the high priority servers, one-half of the traffic will flow on the remaining active link in Po1 and one-half of the traffic will flow on the remaining active link in Po2. Thus, the high priority servers can utilize the available links between port extender 1 and switch 1 and switch 2, while the lower priority servers will undergo the port extender change event and will utilize links between port extender 2 and switch 1 and switch 2.

Figure 4:
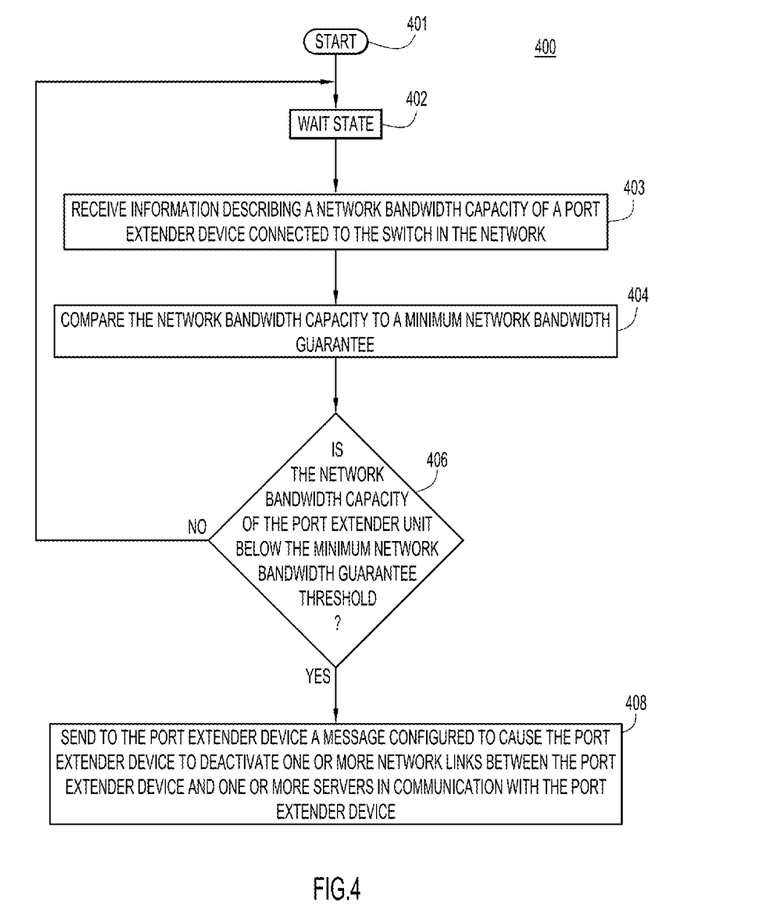
FIG. 4 shows an example flow chart demonstrating operations of a switch device in order to guarantee minimum network bandwidth requirements.

Reference is now made to FIG. 4, which shows an example flow chart 400 depicting operations for a switch to guarantee minimum network bandwidth requirements. At reference numeral 401, the operations start, and at reference numeral 402, the switch operates in a "wait state" where it waits to receive information describing network bandwidth capacity information. At 403, the switch receives information describing a network bandwidth capacity of a port extender device connected to the switch in the network. At 404, the switch compares the network bandwidth capacity to a minimum network bandwidth guarantee. At 406, a determination is made as to whether or not the network bandwidth capacity of the port extender device is below the minimum network bandwidth guarantee threshold. If not, the process reverts to operation 402. If so, the switch, at 408, sends to the port extender device a message configured to cause the port extender device to deactivate one or more network links between the port extender device and one or more servers in communication with the port extender device.

Figure 5:
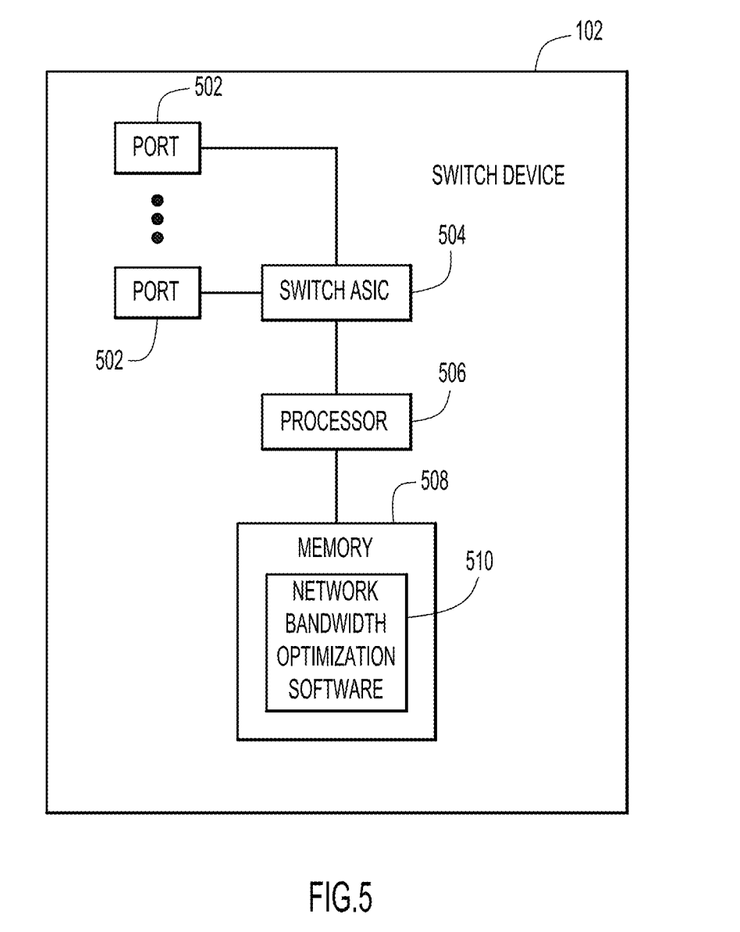
FIG. 5 shows an example block diagram of the switch device configured to guarantee minimum network bandwidth requirements.

Reference is now made to FIG. 5, which shows an example block diagram 102 of a switch configured to guarantee minimum network bandwidth requirements. The block diagram 102 may represent switch 1 or switch 2. The switch 102 comprises, among other components, a plurality of ports 502, a switch application specific integrated circuit (ASIC) 504, a processor 506 and a memory 508. The ports 502 are configured to send and receive network. The ports are coupled to the switch ASIC 504, which is configured to route the communications to the appropriate devices in the network. The processor 506 is, for example, a microprocessor or microcontroller that is configured to execute program logic instructions for carrying out various operations and tasks described herein. For example, the processor 506 can execute the network bandwidth optimization logic 510 stored in memory 508 in order to ensure that minimum network bandwidth requirements are met, as described herein. The memory 508 may comprise read only memory (ROM), random access memory (RAM), magnetic storage media, optical storage media, flash memory, electrical, or other physical/tangible (non-transitory) memory.

The functions of processor 506 may be implemented by logic encoded in one or more tangible computer readable media (e.g., embedded logic such as an application specific integrated circuit, digital signal processor instructions, software that is executed by a processor, etc.) wherein memory 508 stores data used for the operations described herein and stores software or processor executable instructions that are executed to carry out the operations described herein.

The network bandwidth optimization software 510 may take any of a variety of forms, so as to be encoded in one or more tangible computer readable memory media or storage device (e.g., memory 508) for execution, such as fixed logic or programmable logic (e.g., software/computer instructions executed by a processor). In some embodiments, the processor 506 is an ASIC that includes fixed digital logic, programmable logic, or a combination thereof. For example, the processor 506 may be embodied in digital logic gates in a fixed or programmable digital logic integrated circuit, where the digital logic gates are configured to perform instructions of the network bandwidth optimization software 510. In another form, the network bandwidth optimization software 510 may be embodied in one or more tangible computer readable storage media encoded with software comprising computer executable instructions that when executed are operable to perform the operations described herein.

It should be appreciated that the techniques described above in connection with all embodiments may be performed by one or more computer readable storage media that is encoded with software comprising computer executable instructions to perform the methods and steps described herein. For example, the operations performed by switch 1 and switch 2 may be performed by one or more computer or machine readable storage media or device executed by a processor and comprising software, hardware or a combination of software and hardware to perform the techniques described herein.

In summary, a method is provided comprising: at a switch in a network, receiving information describing a network bandwidth capacity of a port extender device connected to the switch in the network, wherein the port extender device is configured to provide ports for the switch; comparing the network bandwidth capacity to a minimum network bandwidth guarantee threshold; and if it is determined at the switch that the network bandwidth capacity of the port extender device is below the minimum network bandwidth guarantee threshold, sending to the port extender device a message configured to cause the port extender device to deactivate one or more network links between the port extender device and one or more servers in communication with the port extender device.

In addition, a computer-readable storage media is provided that is encoded with software comprising computer executable instructions and when the software is executed operable to: receive information describing a network bandwidth capacity of a port extender device connected to a switch in a network, wherein the port extender device is configured to provide ports for the switch; compare the network bandwidth capacity to a minimum network bandwidth guarantee threshold; and if it is that the network bandwidth capacity of the port extender device is below the minimum network bandwidth guarantee threshold, generate a message to be sent to the port extender device, the message configured to cause the port extender device to deactivate one or more network links between the port extender device and one or more servers in communication with the port extender device.

Furthermore, an apparatus is provided comprising: a plurality of ports; and a processor coupled to the ports, and further configured to: receive information describing a network bandwidth capacity of a port extender device connected in a network, wherein the port extender device is configured to provide ports; compare the network bandwidth capacity to a minimum network bandwidth guarantee threshold; and if it is determined that the network bandwidth capacity of the port extender device is below the minimum network bandwidth guarantee threshold, generate a message to be sent to the port extender device, the message configured to cause the port extender device to deactivate one or more network links between the port extender device and one or more servers in communication with the port extender device.

The above description is intended by way of example only. Various modifications and structural changes may be made therein without departing from the scope of the concepts described herein and within the scope and range of equivalents of the claims.

What is claimed is:
1. A method comprising:
at a first switch in a network, the first switch connected over first port links to a multi-homed first port extender device configured to provide an initially active first link with a server over which the first switch communicates with the server, the first switch connected to a second switch that is connected to a second port extender device configured to provide an initially passive second link with the server, the second switch connected over second port links to the first port extender, the first switch configured with information indicating a minimum bandwidth capacity requirement of the first port extender for communication with the server that is to be guaranteed:
routing traffic to the server via a first path including the first port links and the first port extender, and via a second path including the second switch, the second port links, and the first extender;
receiving information describing a network bandwidth capacity of the first port extender device for communication with the server, including a first network bandwidth capacity of the first port links and a second network bandwidth capacity of the second port links;
comparing the received network bandwidth capacity represented as a sum of the first and second network bandwidth capacities to the minimum bandwidth capacity requirement that is to be guaranteed; and if the comparing indicates that the received network bandwidth capacity of the first port extender is less than the minimum network bandwidth capacity requirement that is to be guaranteed, initiating a port extender device change event to deactivate the first link and activate the second link to enable communication between the first switch and the server through the second switch and the second port extender device instead of the first port extender.

2. The method of claim 1, wherein the second switch is configured to communicate with the first port extender device, and receiving comprises receiving the information describing the network bandwidth capacity of the first port extender device from the first port extender device or from the second switch in communication with the first port extender device.

3. The method of claim 1, wherein:
receiving comprises receiving information describing a number of available links between the first port extender device and the first switch; and
comparing comprises comparing the number of available links to a minimum number of available links requirement described in the minimum network bandwidth capacity requirement.

4. The method of claim 1, wherein receiving the information describing the network bandwidth capacity of the first port extender device comprises, at the first switch, receiving from the first port extender first network bandwidth capacity information that is descriptive of the first network bandwidth capacity between the first port extender device and the first switch and receiving from the second switch second network bandwidth capacity information that is descriptive of the second network bandwidth capacity between the first port extender and the second switch in the network.

5. The method of claim 4, further comprising comparing the network bandwidth capacity to the minimum network bandwidth capacity requirement of the first network bandwidth capacity or the second network bandwidth capacity.

6. The method of claim 5, wherein initiating further comprises sending to the first port extender device a message configured to cause the first port extender device to deactivate the active link when either the first network bandwidth capacity or the second network bandwidth capacity is below the minimum network bandwidth requirement.

7. The method of claim 1, wherein the first port extender includes an additional active link to an additional server over which the first switch communicates with the additional server, the method further comprising:
determining whether the additional server has a higher priority status relative to the server;
if the comparing indicates that the received network bandwidth capacity of the first port extender is less than the minimum network bandwidth capacity requirement and if it is determined that the additional server has a higher priority status relative to the server, in addition to the initiating, sending to the first port extender device a message comprising instructions configured to cause the first port extender device to maintain the additional active link with the additional server to enable the additional server to continue communication with the first switch through the first port extender while the server communicates with the first switch through the second port extender.

8. A non-transitory computer-readable storage media encoded with software comprising computer executable instructions and when the software is executed operable to, at a first switch in a network, the first switch connected over first port links to a multi-homed first port extender device configured to provide an initially active first link with a server over which the first switch communicates with the server, the first switch connected to a second switch that is connected to a second port extender device configured to provide an initially passive second link with the server, the second switch connected over second port links to the first port extender, the first switch configured with information indicating a minimum bandwidth capacity requirement of the first port extender for communication with the server that is to be guaranteed:
route traffic to the server via a first path including the first port links and the first port extender, and via a second path including the second switch, the second port links, and the first extender;
receive information describing a network bandwidth capacity of the first port extender device for communication with the server, including a first network bandwidth capacity of the first port links and a second network bandwidth capacity of the second port links;
compare the received network bandwidth capacity represented as a sum of the first and second network bandwidth capacities to the minimum bandwidth capacity requirement that is to be guaranteed; and
if the compare indicates that the received network bandwidth capacity of the first port extender is less than the minimum network bandwidth capacity requirement, initiate a port extender device change event to deactivate the first link and activate the second link to enable communication between the first switch and the server through the second switch and the second port extender device instead of the first port extender.

9. The computer-readable storage media of claim 8, wherein the instructions operable to receive comprise instructions operable to receive information describing a number of available network links between the first port extender device and the first switch, and wherein the instructions operable to compare comprise instructions operable to compare the number of available network links to a minimum number of available network links requirement.

10. The computer-readable storage media of claim 8, wherein the instructions operable to, at the first switch, receive from the first port extender the information describing the network bandwidth capacity of the first port extender device comprise instructions operable to receive first network bandwidth capacity information that is descriptive of the first network bandwidth capacity between the first port extender device and the first switch, and to receive from the second switch second network bandwidth capacity information that is descriptive of the second network bandwidth capacity between the first port extender device and the second switch in the network.

11. The computer-readable storage media of claim 10, further comprising instructions operable to compare to the minimum network bandwidth capacity requirement one of the first network bandwidth capacity or the second network bandwidth capacity.

12. An apparatus comprising:
a plurality of ports; and
a processor of a first switch coupled to the ports,
at least one of the ports in communication over first port links with a multi-homed first port extender device configured to provide an initially active first link with a server over which the first switch communicates with the server, the first switch connected to a second switch that is connected to a second port extender device configured to provide an initially passive second link with the server, the second switch connected over second port links to the first port extender, the first switch configured with information indicating a minimum bandwidth capacity requirement of the first port extender for communication with the server that is to be guaranteed, the processor configured to:

route traffic to the server via a first path including the first port links and the first port extender, and via a second path including the second switch, the second port links, and the first extender;

receive information describing a network bandwidth capacity of the first port extender device for communication with the server, including a first network bandwidth capacity of the first port links and a second network bandwidth capacity of the second port links;

compare the received network bandwidth capacity represented as a sum of the first and second network bandwidth capacities to the minimum bandwidth capacity requirement that is to be guaranteed; and if the compare indicates that the received network bandwidth capacity of the first port extender is less than the minimum network bandwidth capacity requirement, initiate a port extender device change event to deactivate the first link and activate the second link to enable communication between the first switch and the server through the second switch and the second port extender device instead of the first port extender.

13. The apparatus of claim 12, wherein the processor is further configured to receive information describing a number of available network links between the first port extender device and the first switch, and wherein the instructions operable to compare comprise instructions operable to compare the number of available links to a minimum number of available network links requirement.

14. The method of claim 1, wherein the second extender port is a multi-homed extender port and is connected with the first switch.

15. The method of claim 3, wherein:
the receiving comprises receiving information describing a total number of available links for both the first port links and the second port links combined; and
the comparing comprises comparing the total number of available links to the minimum number of links requirement.

16. The computer-readable storage media of claim 8, wherein the second extender port is a multi-homed extender port and is connected with the first switch.

17. The computer-readable storage media of claim 9, wherein:
the instructions operable to receive include instructions operable to receive information describing a total number of available links for both the first port links and the second port links combined; and
the instructions operable to compare comprise instructions operable to compare the total number of available links to the minimum number of links requirement.

18. The apparatus of claim 12, wherein the second extender port is a multi-homed extender port and is connected with the first switch.

* * * * *